(12) United States Patent
Choksi

(10) Patent No.: US 6,518,898 B1
(45) Date of Patent: Feb. 11, 2003

(54) SYSTEM AND METHOD OF BACKGROUND OFFSET CANCELLATION FOR FLASH ADCS

(75) Inventor: Ojas M. Choksi, Pittsburgh, PA (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/911,792

(22) Filed: Jul. 23, 2001

(51) Int. Cl.[7] ................................................ A03M 1/06
(52) U.S. Cl. ...................................................... 341/118
(58) Field of Search ............................... 341/118, 155, 341/156, 159

(56) References Cited

U.S. PATENT DOCUMENTS 6,351,227 B1 * 2/2002 Rudberg ..................... 341/118

OTHER PUBLICATIONS

"A CMOS 6–b, 200 MSample/s, 3 V–Supply A/D Converter for a PRML Read Channel LSI," IEEE Journal of Solid–State Circuits, vol. 31, No. 11, Nov. 1996, pp. 1831–1836 (Sankoru Tsukamoto, Ian Dedic, Toshiaki Endo, Kazu-Yoshi Kikuta, Kunhiko Goto and Osamu Kobayashi).

* cited by examiner

Primary Examiner—Brian Young
(74) Attorney, Agent, or Firm—W. Daniel Swayze, Jr.; W. James Brady; Frederick J. Telecky, Jr.

(57) ABSTRACT

A background offset cancellation technique based on interleaved auto-zero (IAZ) architecture for flash ADCs, moves the reference tap values up and down to accommodate auto-zeroing of differential comparators rather than switching the differential comparator reference point between two distinct reference taps. The technique eliminates a large number of complementary switches necessary to provide the reference tap values leading to substantial savings in area and power, and provides for improved settling characteristics of the reference ladder.

14 Claims, 11 Drawing Sheets

FIG. 7C $$V_{RHL} = V_{RH} - V_{RL}, V_{R63} = V_{R63+} - V_{R63-}, \ldots = V_{R1+} - V_{R1-}, V_{R0} = 0$$

SYSTEM AND METHOD OF BACKGROUND OFFSET CANCELLATION FOR FLASH ADCS

BACKGROUND OF THE INVENTION

1. Field of the Invention

This invention relates generally to high-speed flash analog-to-digital converters (ADCs), and more particularly to a method of background offset cancellation for flash ADCs based on interleaved auto-zero (IAZ) architecture.

2. Description of the Prior Art

Comparators are used in flash ADCs to compare the input voltage with the reference voltage generated by the reference ladder and make a decision based on the relative value of the input voltage with respect to the reference voltage. Differential comparators with frequent auto-zeroing are used for high-speed flash ADCs having 6 or more bits of resolution. The advantages of fully differential schemes include reduced charge injection error, high common-mode signal noise rejection and increased immunity to the power supply and substrate noise. Fully differential comparators are indispensable to achieve high resolution for flash ADCs operating in a mixed-signal environment. The minimum resolution of a comparator is limited by its offset voltage and the low frequency 1/f noise. Techniques such as auto-zeroing serve to cancel the comparator offset, reduce its low frequency 1/f noise and sample the reference levels for comparison with the input. During the comparison phase, the stored reference value is subtracted from the input and the result is amplified by the comparator to output a decision. Auto-zeroing is essential for high-resolution flash ADCs. Typically, a comparator is auto-zeroed every clock cycle by assigning a portion of the clock period for auto-zeroing and the remaining portion for conversion. Frequent auto-zeroing is desirable for obtaining high resolution, but it causes various transient noises, kickback noise to the reference resistor ladder, and power supply noise during the transition from auto-zeroing to comparison and from comparison to auto-zeroing. Further, since there is an auto-zeroing period between two comparison periods, continuous conversion is not possible. Various other problems present in this conventional interleaved auto-zeroing implementation include: 1) Since half of the conversion cycle time is spent on auto-zeroing, only half of the clock period is available for conversion, requiring the comparator circuit to be designed at twice the operating speed; 2) As the frequency of operation increases, the amount of time available for auto-zeroing shortens; 3) Kickback noise occurs on the reference ladder when the comparator is auto-zeroed; and 4) The resistance of the reference ladder is determined by the RC time constant during the auto-zeroing phase for a given sampling capacitor size; and since this time constant is a fraction of the operating clock period, the resistance of the reference ladder depends on the conversion rate.

The foregoing and other like problems restrict high-speed ADC operation and makes it difficult to operate the ADC in a mixed-signal environment. In order to reduce various transient noises and to achieve continuous conversion, it is desirable to reduce the auto-zeroing rate without requiring an extra auto-zeroing period for the whole ADC and to design a high-speed comparator that compares several times with one auto-zeroing.

SUMMARY OF THE INVENTION

To meet the above and other objectives, the present invention provides an offset cancellation technique that performs offset cancellation in the background (i.e. without interrupting analog-to-digital conversion) by using one extra comparator slice and by making the auto-zeroing period independent of the operating clock period. The time available for the conversion process is thus extended while the state transition period between auto-zeroing and comparison is reduced. At any instance of time, one comparator is auto-zeroed while the remaining comparators perform A/D conversion.

In one aspect of the invention, a background offset cancellation circuit that employs differential comparators and that is suitable for use with a high-speed flash ADC having 6 or more bits of resolution is implemented to reduce the number of complementary switches necessary to provide reference tap values leading to substantial saving in die area.

In another aspect of the invention, a background offset cancellation circuit that employs differential comparators and that is suitable for use with a high-speed flash ADC having 6 or more bits of resolution is implemented to reduce the series switch resistance and the parasitic junction capacitances in the reference voltage path, improving the settling characteristics of the reference ladder.

In yet another aspect of the invention, a background offset cancellation circuit that employs differential comparators and that is suitable for use with a high-speed flash ADC having 6 or more bits of resolution is implemented to minimize the size and the power consumption of the clock driver(s) necessary to operate the complementary switches associated with setting reference tap values needed for auto-zeroing.

In still another aspect of the invention, a background offset cancellation circuit that employs differential comparators and that is suitable for use with a high-speed flash ADC having 6 or more bits of resolution is implemented to simplify the layout of the comparator slice.

In still another aspect of the invention, a background offset cancellation circuit that employs differential comparators and that is suitable for use with a high-speed flash ADC having 6 or more bits of resolution is implemented to cancel the offsets of the operational amplifier and remove the finite gain error.

BRIEF DESCRIPTION OF THE DRAWINGS

Other aspects and features of the present invention, and many of the attendant advantages of the present invention, will be readily appreciated as the same become better understood by reference to the following detailed description when considered in connection with the accompanying drawings in which like reference numerals designate like parts throughout the figures thereof and wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
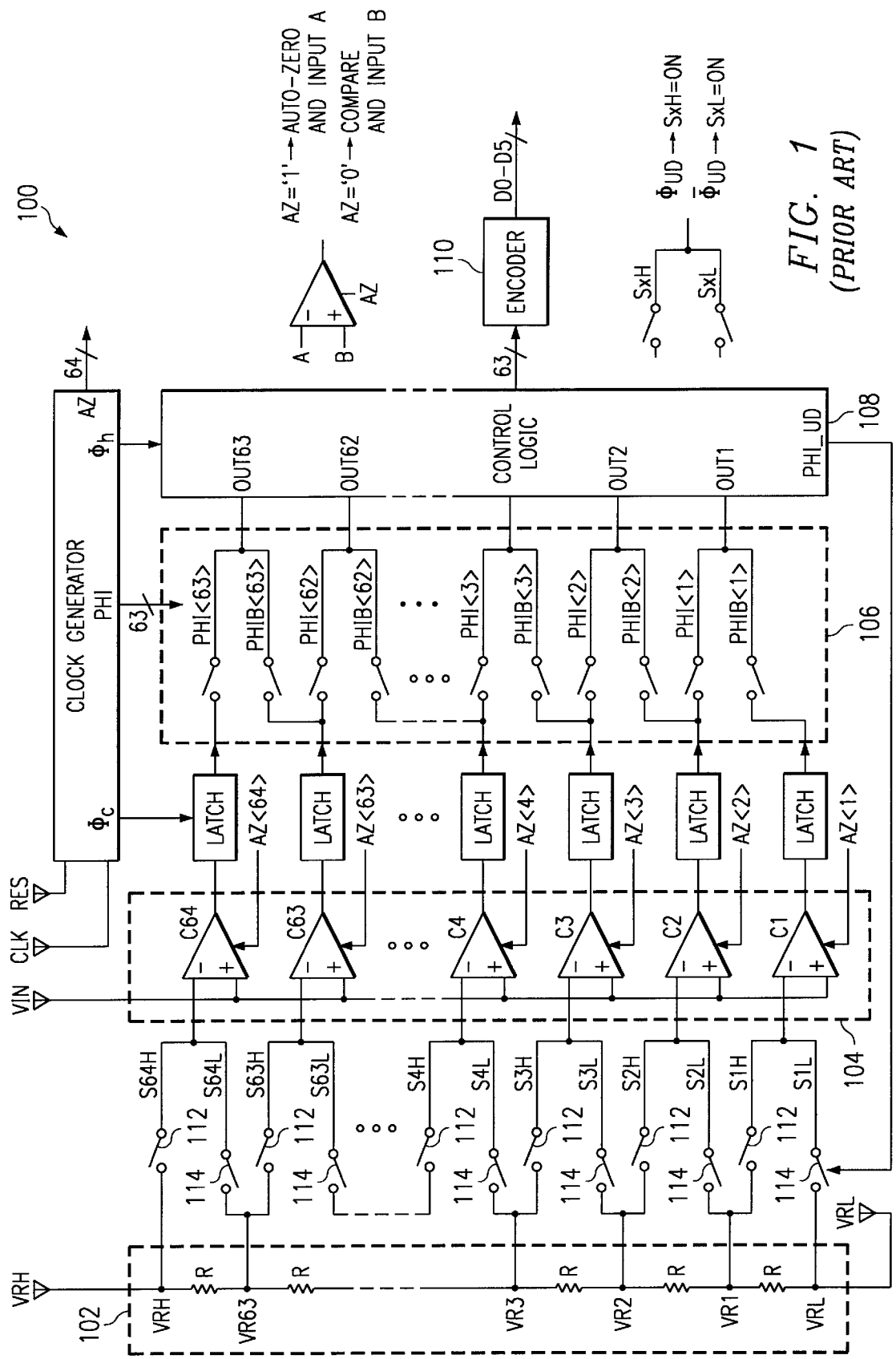
FIG. 1 is a block diagram illustrating a conventional flash ADC using an interleaved auto-zeroing (IAZ) technique that is known in the prior art.

FIG. 1 is a block diagram illustrating a conventional flash ADC 100 using an interleaved auto-zeroing (IAZ) technique for a 6-bit converter that is known in the prior art. For convenience, a single-ended version is shown, but in practice, a fully-differential version is generally implemented. Reference voltages, generated by a reference resistor ladder 102, are depicted as $V_{RL}, V_{R1}, V_{R2}, \ldots V_{R63}, V_{RH}$. Comparators 104 are depicted as $C_1, C_2, C_3, \ldots$ Up to $C_{64}$.

Figure 2A:
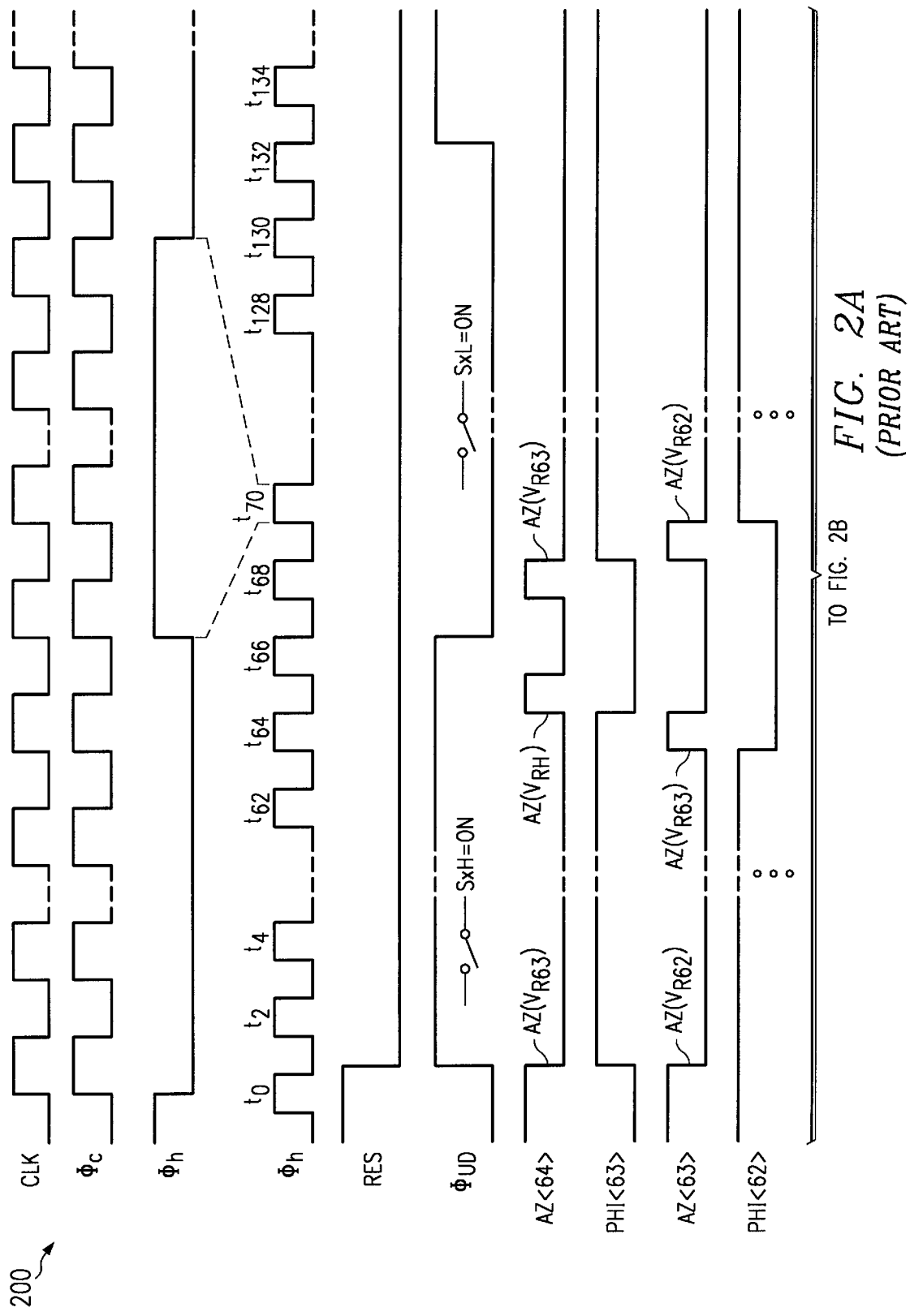
FIGS. 2a and b are waveform timing diagram illustrating timing relationships for various signals associated with the conventional flash ADC using IAZ shown in FIG. 1.
Figure 2B:
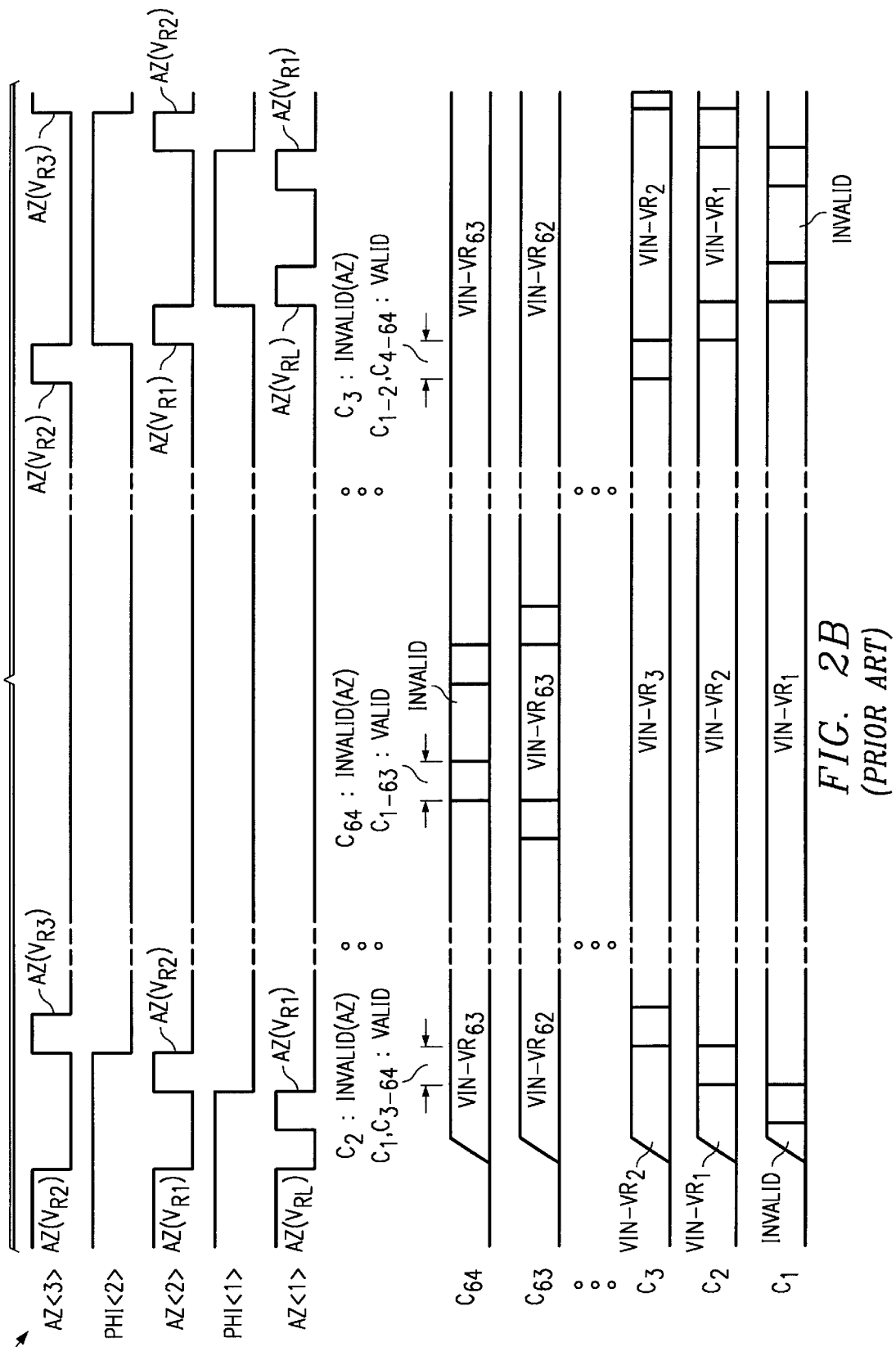

FIG. 2 is a waveform timing diagram 200 illustrating timing relationships for various signals associated with the conventional flash ADC 100 using IAZ shown in FIG. 1. During time $t_0$, all the comparators ($C_1$–$C_{64}$) 104 are auto-zeroed with reference voltages $V_{RL}$–$V_{R63}$ respectively, before the conversion starts. During the next period $t_1$, all comparators 104 are set to the comparison state and the conversion is achieved by comparators $C_2$–$C_{64}$. During the next period $t_2$, comparator $C_1$, that was auto-zeroed with $V_{RL}$ during $t_0$, is now auto-zeroed with $V_{R1}$ while the conversion is achieved by $C_2$–$C_{64}$. During the next period $t_3$, comparator $C_2$ that that was previously auto-zeroed with $V_{R1}$ during $t_0$, is now auto-zeroed with $V_{R2}$ and the conversion is achieved by $C_1$ and $C_3$–$C_{64}$. A sixty-four to sixty-three multiplexer 106 after the comparators 104 selects the valid comparator 104 outputs to a bubble correction circuit 108 and a thermometer code encoder 110. After $C_{64}$ is auto-zeroed with $V_{RH}$ during $t_{65}$, switches ($S_{1H}$–$S_{64H}$) 112 turn off and switches ($S_{1L}$–$S_{64L}$) 114 turn on ($t_{66}$–$t_{67}$) and $C_{64}$ is again auto-zeroed with $V_{R63}$ during $t_{68}$. Then $C_{63}$ is auto-zeroed with $V_{R62}$ during $t_{69}$ and the sequence goes on until $C_1$ is auto-zeroed with $V_{RL}$ during $t_{131}$. Finally, switches ($S_{1L}$–$S_{64L}$) 114 turn off and switches ($S_{1H}$–$S_{64H}$) 112 turn on ($t_{132}$–$t_{133}$) and again $C_1$ is auto-zeroed with $V_{R1}$. The foregoing sequence of events repeats continuously during A/D conversion. The required rate of auto-zeroing is determined by the rate of charge leakage from the sampling capacitor in the comparator 104 for a particular technology.

The IAZ architecture shown in FIG. 1 functions with only two comparators changing state once every n comparisons (assuming that the auto-zeroing period is n times the comparison+reset period): one from auto-zeroing to comparison and the other from comparison to auto-zeroing. In a conventional ADC, all comparators change states twice for every comparison. Significant features of the IAZ architecture depicted in FIG. 1 include: 1) High-speed conversion is possible since the whole clock period is available for conversion; 2) Kickback noise and the power supply noise can be reduced since all comparators 104 do not perform auto-zeroing at the same time; 3) Auto-zeroing period is independent of the conversion time and its duration can be set independently according to the ladder settling time dictated by the reference ladder 102 resistance, the comparator load resistance, the series switch (e.g., 306, 308 in FIG. 3) resistance and the sampling capacitance value; 4) Power consumption in the reference ladder 102 can be reduced by setting the high reference ladder resistance 120. This is possible since the auto-zeroing period can be set independently of the conversion period; and 5) Because of the reduced state transition between the auto-zeroing and comparison, the overall power consumption is reduced.

During time period $t_0$–$t_{65}$, all the comparators ($C_1$–$C_{64}$) 104 are connected to the reference taps $V_{R1}$–$V_{RH}$ respectively, as stated herein before. It was shown that after $t_{65}$, switches ($S_{1H}$–$S_{64H}$) 112 turn off and switches ($S_{1L}$–$S_{64L}$) 114 subsequently turn on during time period $t_{66}$–$t_{67}$, such that all the comparators ($C_1$–$C_{64}$) 104 are then connected to the reference taps $V_{RL}$–$V_{R63}$ respectively. After $t_{131}$, all the comparators ($C_1$–$C_{64}$) 104 are again connected to the reference taps $V_{R1}$–$V_{RH}$ respectively, and the sequence goes on, also stated above. Since the reference voltage value is always stored in the capacitance during auto-zeroing and is subtracted from Vin during conversion, moving of the reference voltage taps does not affect conversion and hence does not cause any systematic offset.

Figure 3:
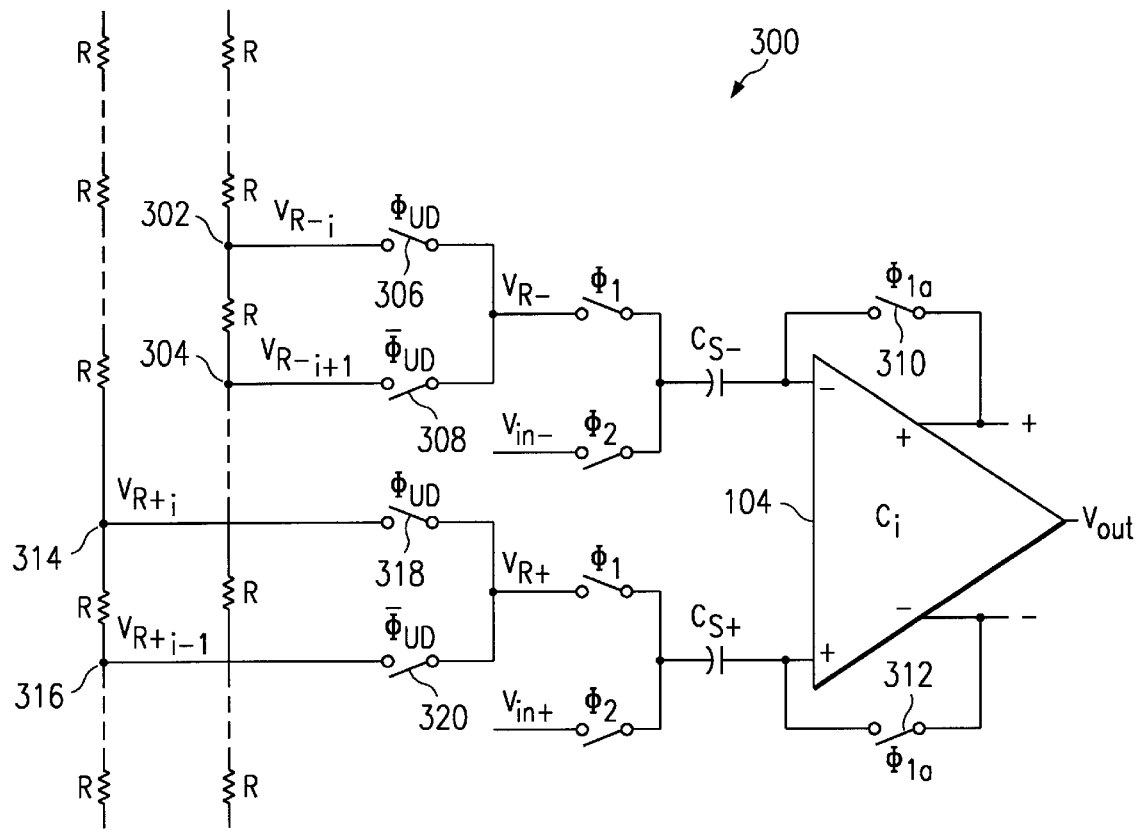
FIG. 3 is a schematic diagram illustrating a typical reference voltage tap switching implementation using a differential scheme for the conventional flash ADC using IAZ shown in FIG. 1.
Figure 4:
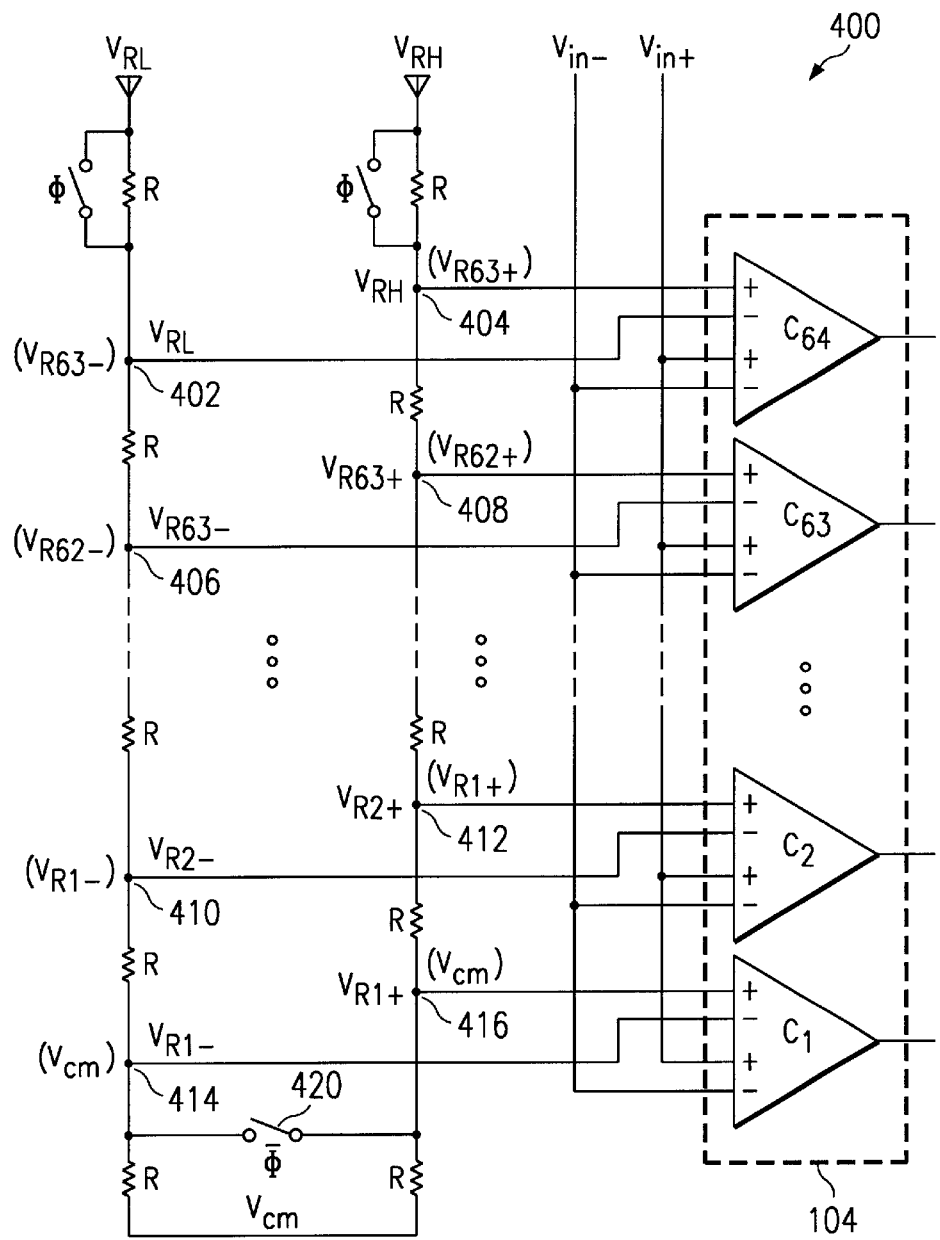
FIG. 4 is a schematic diagram illustrating a conceptual implementation of a background offset cancellation circuit architecture according to one embodiment of the present invention.
Figure 4:
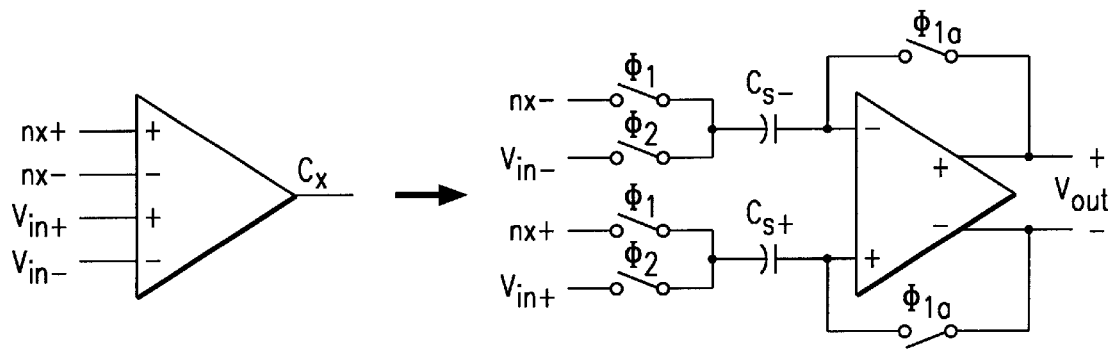

FIG. 3 is a schematic diagram illustrating a typical reference voltage tap switching architecture 300 for the conventional flash ADC 100 using IAZ shown in FIG. 1. When the comparator ($C_i$) 104 is auto-zeroed during the clock phase $\phi_1$, sampling capacitors $C_{S+}$ and $C_{S-}$ sample the reference voltages $V_{R+}$ and $V_{R-}$ respectively, at one end and the offset of the comparator at the other end. Switches 310, 312 connected around the opamp 104 and controlled by the clock signal $\phi_1 a$ are opened first to reduce the input dependent charge injection as known in the prior art. The clock signal $\phi_{1a}$ is similar to $\phi_1$ except that its falling edge precedes the falling edge of $\phi_1$ in time. During the clock phase $\phi_2$, the input signal is sampled relative to the stored reference value and a comparison is made. Reference tap switching is achieved by connecting the reference point $V_{R+}$ of the comparator ($C_i$) 104 (i=1–64) to either of the two reference taps ($V_{R+_i}$, and $V_{R+_{i-1}}$) 314, 316 and by connecting $V_{R-}$ of the comparator ($C_i$) 104 (i=1–64) to either of the two reference taps ($V_{R-_i}$ and $V_{R-_{i-1}}$) 302, 304 respectively by using four additional switches 306, 308, 318, 320 as shown in FIG. 3. When $\phi_{UD}$ is high, $V_{R+}$ is connected to $V_{R+_i}$ and $V_{R-}$ is connected to $V_{R-_{i-1}}$ through switches 318, 306 respectively. Similarly, when $\overline{\phi}UD$ is high, $V_{R+}$ is connected to $V_{R+_{i-1}}$ and $V_{R-}$ is connected to $V_{R-_{i-1}}$ through switches 320, 308 respectively. Since these switches 306, 308, 318, 320 to the reference taps ($V_{R+_i}, V_{R+_{i-1}}, V_{R-_i}$, and $V_{R-_{i-1}}$) 314, 316, 302, 304 are normally complementary type switches for wider analog input range, eight extra transistors (four 'n' and four 'p') are necessary per comparator 104 slice. Hence, for an n-bit Flash converter, a total of $8 \times 2^n$ extra transistors are required. These additional transistors are problematic because: 1) A large number of switches are required to switch between the reference ladder taps for comparison, which occupies a significant amount of die area; 2) Since all the switches are driven by a common clock-driver, the clock driver has to be huge, again increasing the amount of required die area. Further, driving such a large load presented by these switches consumes significant amounts of power; 3) Since two complementary switches are connected to each tap in the ladder, the capacitance at each tap is twice compared to that presented using the conventional non-interleaved auto-zeroing scheme and increases the settling time of the reference ladder; and 4) The series switch resistance of the switches 306, 308, 318, 320 connecting the reference tap to the sampling capacitor adds to the Thevenin equivalent resistance at a given tap, and hence degrades the settling time of the reference ladder FIG. 4 is a schematic diagram illustrating a conceptual differential implementation of a background offset cancellation circuit architecture 400 according to one embodiment of the present invention. The problems discussed above with reference to the voltage tap switching architecture 300 shown in FIG. 3 are solved with the circuit architecture 400 by connecting the comparators 104 to the reference taps 402–416 in a conventional manner (i.e. $V_{R+}$ and $V_{R-}$ are directly connected to the reference taps without using the series switches 306, 308, 318, 320 as shown in FIG. 3) and then moving the reference tap values up and down by ½ LSB (for differential configuration). Since the bottom switch 420 is directly in the current path when it is closed, and since the switches have a finite "on" resistance, this implementation introduces a constant systematic offset and also prevents implementation of accurate reference tap 402–416 values. One embodiment of a circuit architecture that overcome these problems while taking advantage of the conceptual technique described with reference to FIG. 4 is shown in FIG. 5.

Figure 5:
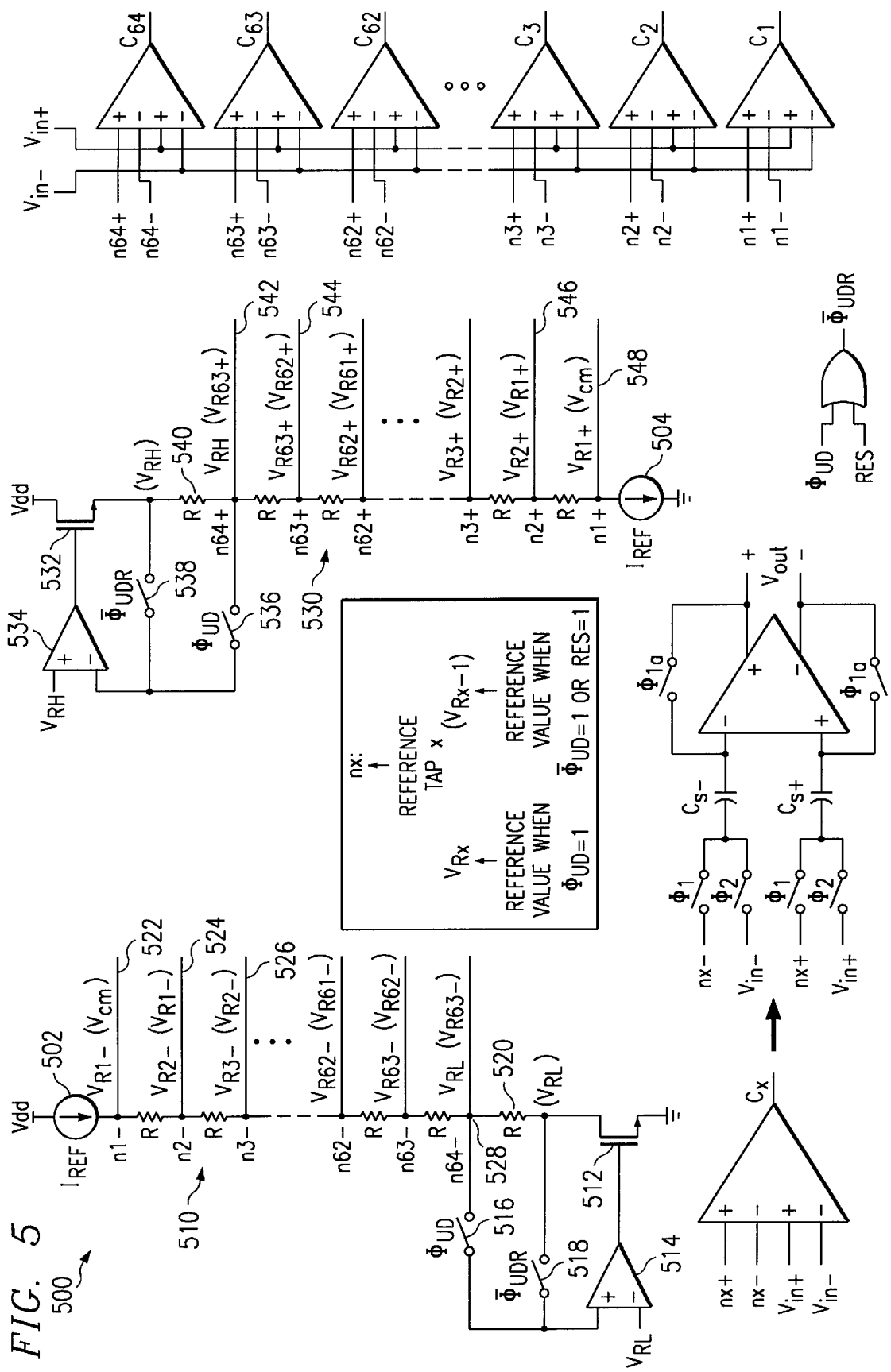
FIG. 5 is a schematic diagram illustrating one actual implementation of a background offset cancellation circuit architecture according to one embodiment of the present invention.
Figure 6A:
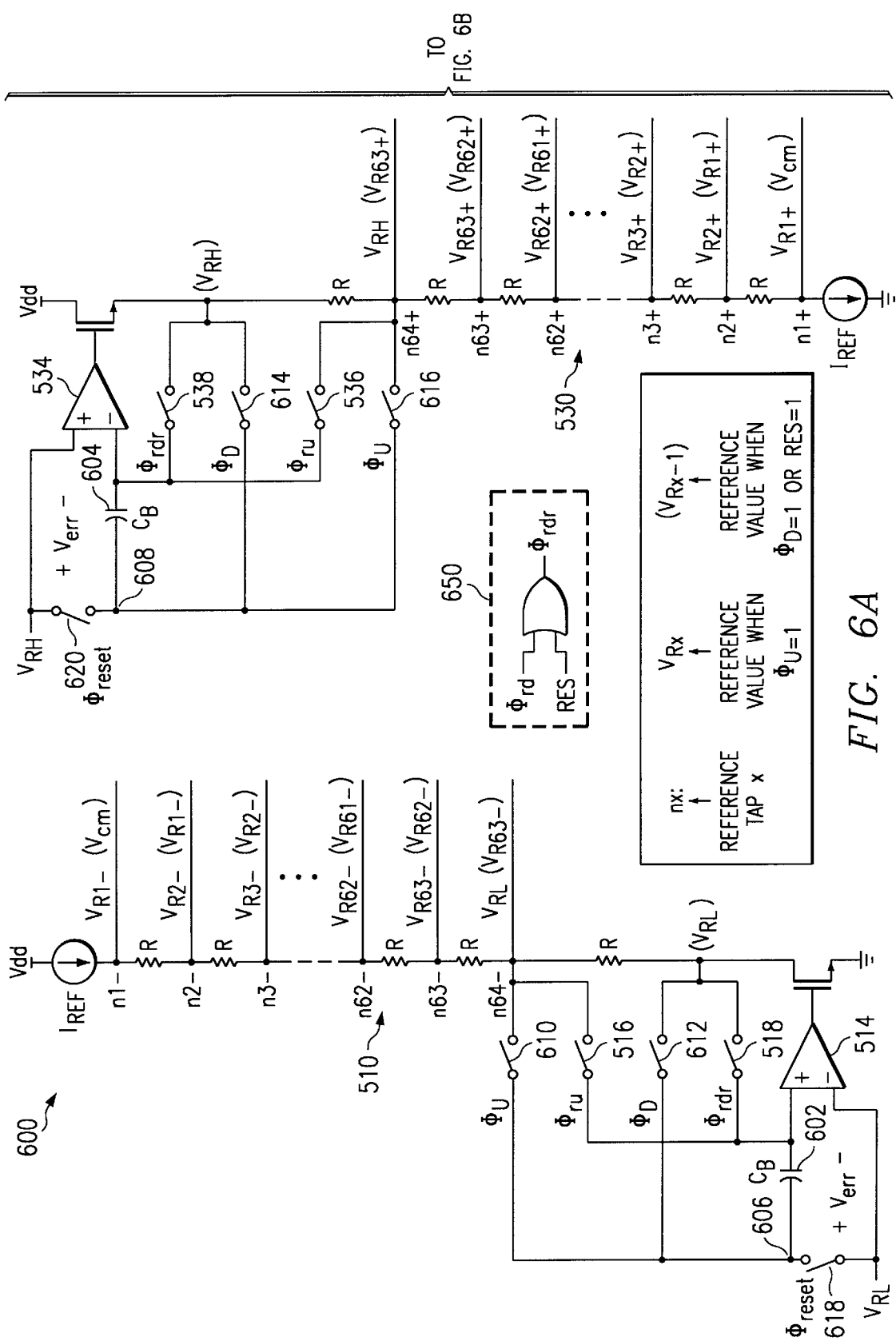
FIGS. 6a and b are schematic diagram illustrating one actual implementation of a background offset cancellation circuit architecture which cancels the offset of the operational amplifiers according to one embodiment of the present invention.
Figure 6B:
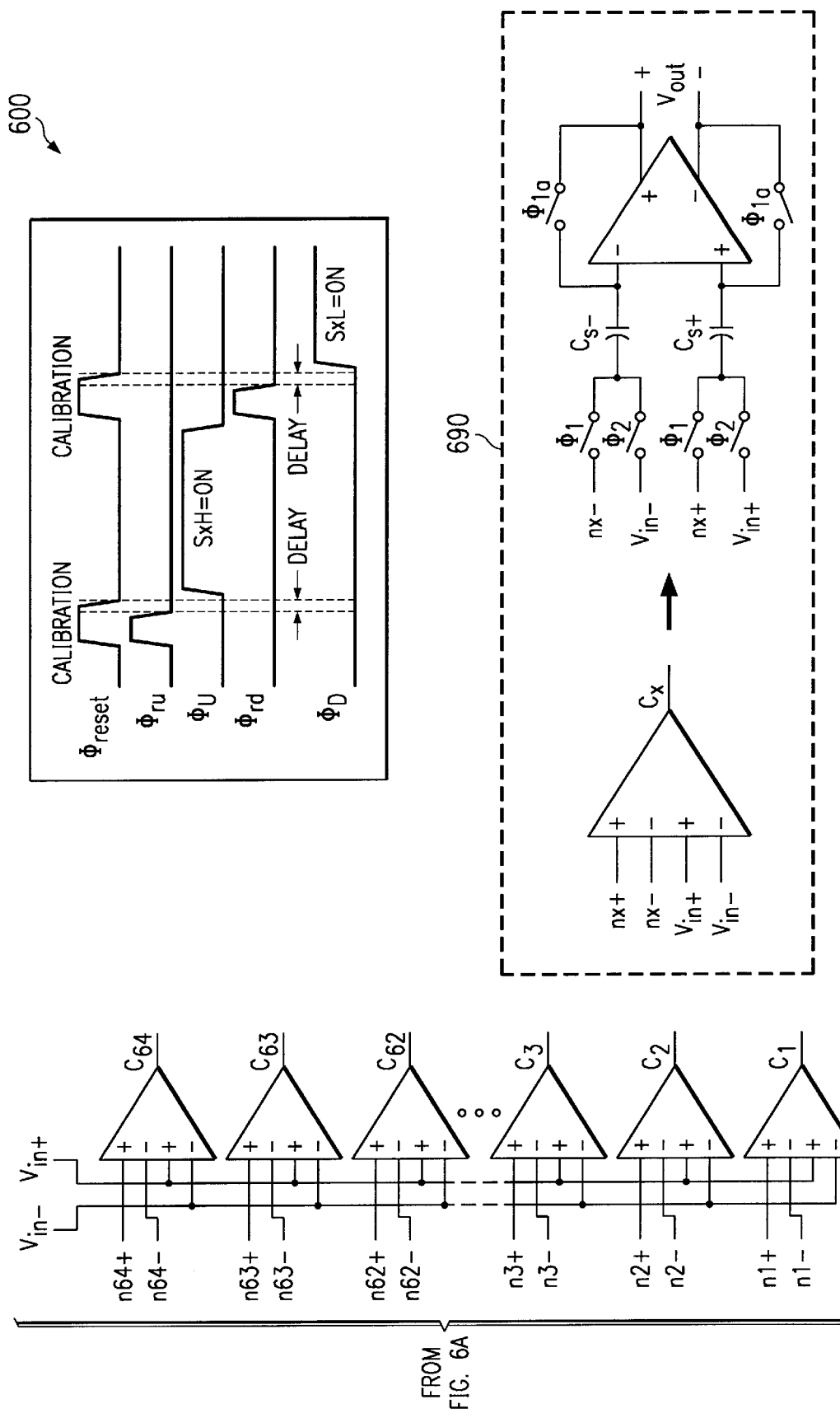

FIG. 5 is a schematic diagram illustrating one actual implementation of a background offset cancellation circuit 500 according to one embodiment of the present invention. The background offset cancellation circuit 500 can be seen to include a reference current source 502 in the $V_{RL}$ leg 510 as well as a reference current source 504 in the $V_{RH}$ leg 530. The reference current sources 502, 504 should be identical to eliminate any mismatches between them. The $V_{RL}$ leg 510 provides reference voltages $V_{R1-}$, $V_{R2-}$, $V_{R3-}$, . . . , $V_{R63-}$ and $V_{RL}$. The $V_{RH}$ leg 530 provides reference voltages $V_{R1+}$, $V_{R2+}$, $V_{R3+}$, . . . , $V_{R63+}$ and $V_{RH}$. The $V_{RL}$ leg 510 has a switching transistor 512 that is activated by an op-amp 514 that has a feedback loop implemented with a pair of switches 516, 518 and one resistor 520 that forms one resistor ladder element of the $V_{RL}$ leg 510. The $V_{RH}$ leg 530 has a switching transistor 532 that is activated by an op-amp 534 that has a feedback loop implemented with a pair of switches 536, 538 and one resistor 540 that forms one resistor ladder element of the $V_{RH}$ leg 530. The comparators 104 are connected to resistor taps 522–528 and 542–548 in a fashion such as shown in FIG. 4. The reference voltage at each resistor tap 522–528, 542–548 is then switched up and down by ½ LSB as the auto-zeroing and conversion processes advance in a manner such as discussed herein before with respect to FIGS. 1–3. Sources of mismatch affecting the DNL, apart from resistance mismatches include mismatch in the current sources 502, 504. It can be noted that the offsets of the op-amps 514, 534 in FIG. 5 results only in a finite gain error in the overall ADC transfer characteristics and can be corrected by an offset cancellation scheme as shown in FIG. 6 discussed herein below. The present inventor found that the op-amps 514, 534 notably can be high-gain/low bandwidth types since the time period for two complete auto-zero cycles (e.g. $t_{66}$–$t_{67}$ as shown in FIG. 2) is available between successive auto-zeroing; and hence there is sufficient time for the reference ladder values to settle to their correct values. Moreover, the auto-zeroing sequence starting from $t_{68}$ as shown in FIG. 2 can be delayed by a suitable amount of time for the resistor ladder to adequately settle before performing the auto-zeroing of comparator $C_{64}$ with the $V_{R63}$ reference tap value. The internal implementation of the differential comparator and generation of signal $\overline{\phi}_{UDR}$ is also shown in FIG. 5.

The circuit architecture shown in FIG. 5 advantageously eliminates the need for a large number of switches (and hence transistors), leading to substantial savings in die area and power consumption. A further advantage is obtained since the layout of the comparator slice is also simplified. The clock driver for the switches 516, 518, 536, 538 can also be very small since it has to drive now four additional complementary switches as compared to (8×2ⁿ) additional complementary switches required for the scheme shown in FIG. 3, discussed herein before. This reduces the power necessary to operate the clock driver resulting in further savings in IC power consumption. Another advantage of the circuit architecture shown in FIG. 5 is the decreased value of stray capacitance at each reference tap. The reference taps ($n_{1+}$, $n_{2+}$, . . . , $n_{64+}$, and $n_{1-}$, $n_{2-}$, . . . , $n_{64-}$) are directly connected to the sampling capacitor $C_S$ of each comparator $C_i$ (i=1–64) as shown in FIG. 5. Hence, the capacitance at each reference tap ($n_{1+}$, $n_{2+}$, . . . , $n_{64+}$, and $n_{1-}$, $n_{2-}$, . . . , $n_{64-}$) is half as compared to the earlier scheme due to the elimination of two parallel switches present at each reference tap in FIG. 1. This improves the settling time as compared to the conventional scheme. Another advantage is that the Thevenin equivalent resistance at a given reference tap is now determined only by the reference ladder resistance 'R' and the series switch resistance of the respective switch connecting the reference tap to the capacitance $C_S$. The present scheme then eliminates one series switch in the path from the reference tap to $C_S$, resulting in a reduced Thevenin equivalent resistance at the reference tap. This improves the settling characteristics of the resistance ladder during auto-zeroing.

FIG. 6 is a schematic diagram illustrating a circuit architecture 600 to cancel the offsets of the operational amplifiers 514, 534 discussed herein before, according to one embodiment of the present invention. Finite offsets of the opamps 514, 534 scale the voltage steps defined by the resistor ladders 510, 530 proportionately, resulting in a finite gain error in the overall ADC transfer characteristics. In some applications, this can be problematic. The background offset cancellation circuit 600 shown in FIG. 6 is an implementation to correct this finite gain error resulting due to opamp offsets. The background offset cancellation circuit 600 can be seen to include offset sensing capacitors ($C_B$) 602, 604 connecting the positive input of the operational amplifier 514 to node 606 and the negative input of the operational amplifier 534 to node 608. As can also be seen, switches 610, 612 and 618 have been added to switches 516 and 518, and switches 614, 616 and 620 have been added to switches 536 and 538 to further implement the background offset cancellation circuit 600. Switches 610, 516, 612, 518 and 618 are controlled by clock signals $\phi_U$, $\phi_{ru}$, $\phi_D$, $\phi_{rdr}$ and $\phi_{reset}$ respectively, while switches 616, 536, 614, 538 and 620 are controlled by clock signals $\phi_U$, $\phi_{ru}$, $\phi_D$, $\phi_{rdr}$ and $\phi_{reset}$ respectively. The auto-zeroing is now controlled by two non-overlapping clock phases, $\phi_U$ and $\phi_D$, instead of the single clock signal $\phi_{UD}$ shown in FIG. 2. Clock signal $\phi_{ru}$ is high after clock phase $\phi_D$ goes low and before clock phase $\phi_U$ goes high; and clock signal $\phi_{rd}$ is high after clock phase $\phi_U$ goes low and before clock phase $\phi_D$ goes high. The offset cancellation of the opamps 514, 534 is performed during $\phi_{reset}$. During $\phi_{reset}$ switches 618 and 620 are closed, connecting the capacitor $C_B$ 602 between the positive input of the operational amplifier 514 and $V_{RL}$ rererence voltage at the negative input of the opamp 514; while another capacitor $C_B$ 604 is connected between the negative input of the operational amplifier 534 and $V_{RH}$ reference voltage at the positive input of the opamp 534. Further, either of the switches (518 and 538) controlled by $\phi_{rd}$ or (516 and 536) controlled by 100$_{ru}$ is high closing the feedback loop around the operational amplifiers 514, 534 in the switching circuit. The capacitors $C_B$ 602 and $C_B$ 604 sample offset voltages of the operational amplifiers 514 and 534 respectively until $\phi_{rd}$ or $\phi_{ru}$ is high. The falling edge of $\phi_{reset}$ is delayed with respect to the falling edge of $\phi_{rd}$ or $\phi_{ru}$ so that the charge injection of switch 518 and switch 538 when $\phi_{rd}$ goes low or of switch 516 and switch 536 when $\phi_{ru}$ goes low, only matters. The charge injection of these switches (516, 518, 536, 538) can be minimized by either using complementary type transistors exactly balancing their charge injection or by using an additional half-sized dummy transistor via techniques familiar to those skilled in the art. When $\phi_U$ or $\phi_D$ goes high, the reference tap values settle to their correct value after the offset of the operational amplifiers 514, 534 are cancelled because of the capacitor $C_B$ (602, 604) included in the feedback loop. One embodiment of a simple clock generation circuit 650 suitable for use with the background offset cancellation circuit 600 generates clock signal $\phi_{rdr}$, while differential comparator circuit 690 illustrates one internal implementation of a differential comparator suitable for use with the background offset cancellation circuit 600. When the reset signal RES is high, $\phi_{rdr}$ is high and the reference taps $n_{64+}$, $n_{63+}$, . . . , $n_{1+}$ assume the reference values $V_{R63+}$, $V_{R62+}$, . . . , $V_{cm}$ while the reference taps $n_{64-}$, $n_{63-}$, . . . , $n_{1-}$ assume the reference values $V_{R63-}$, $V_{R62-}$, . . . , $V_{cm}$ respectively.

Figure 7A:
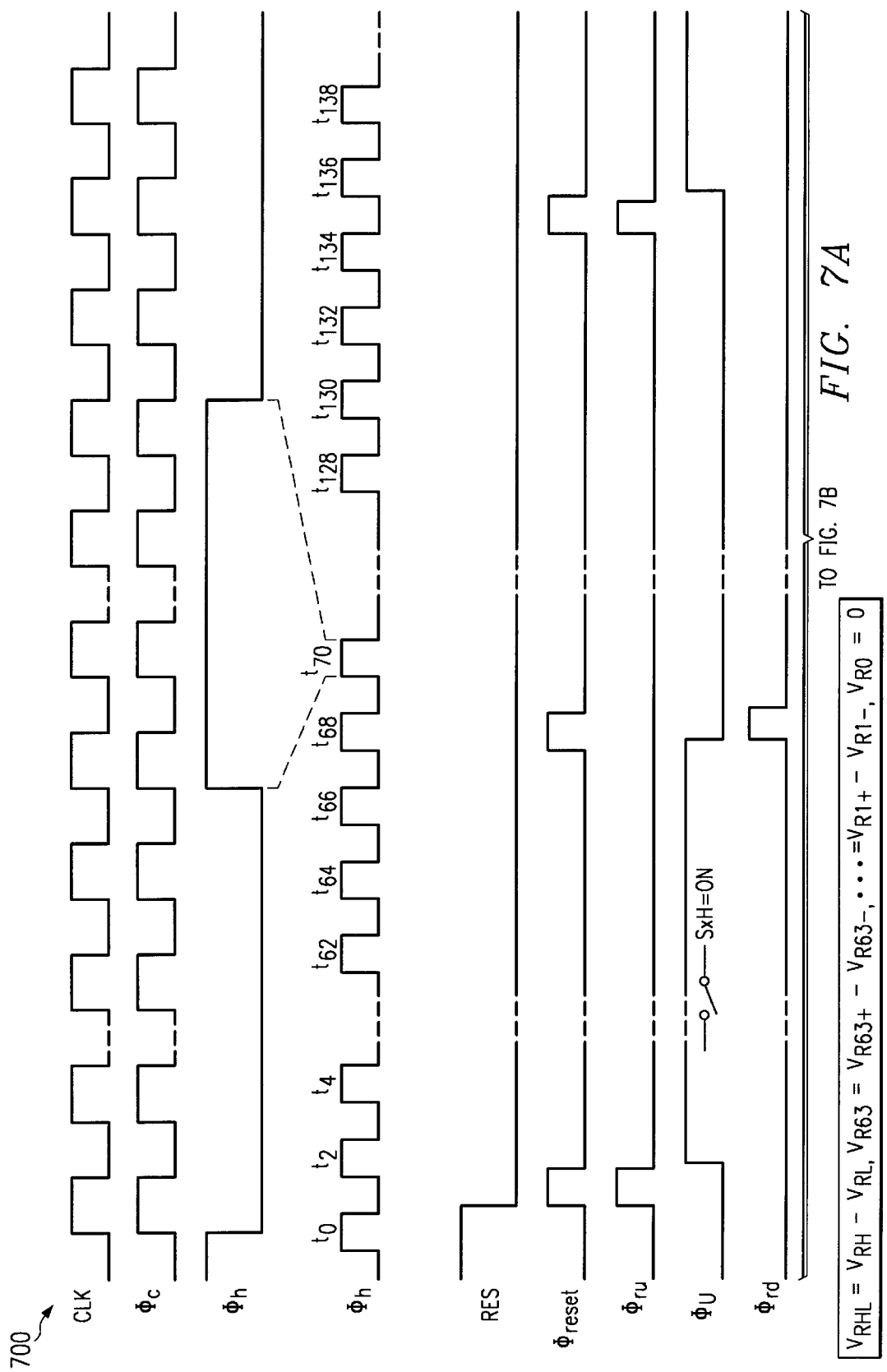
FIGS. 7a, b and c are detailed waveform timing diagram illustrating timing relationships for various signals associated with the background offset cancellation circuit architecture shown in FIG. 6.
Figure 7B:
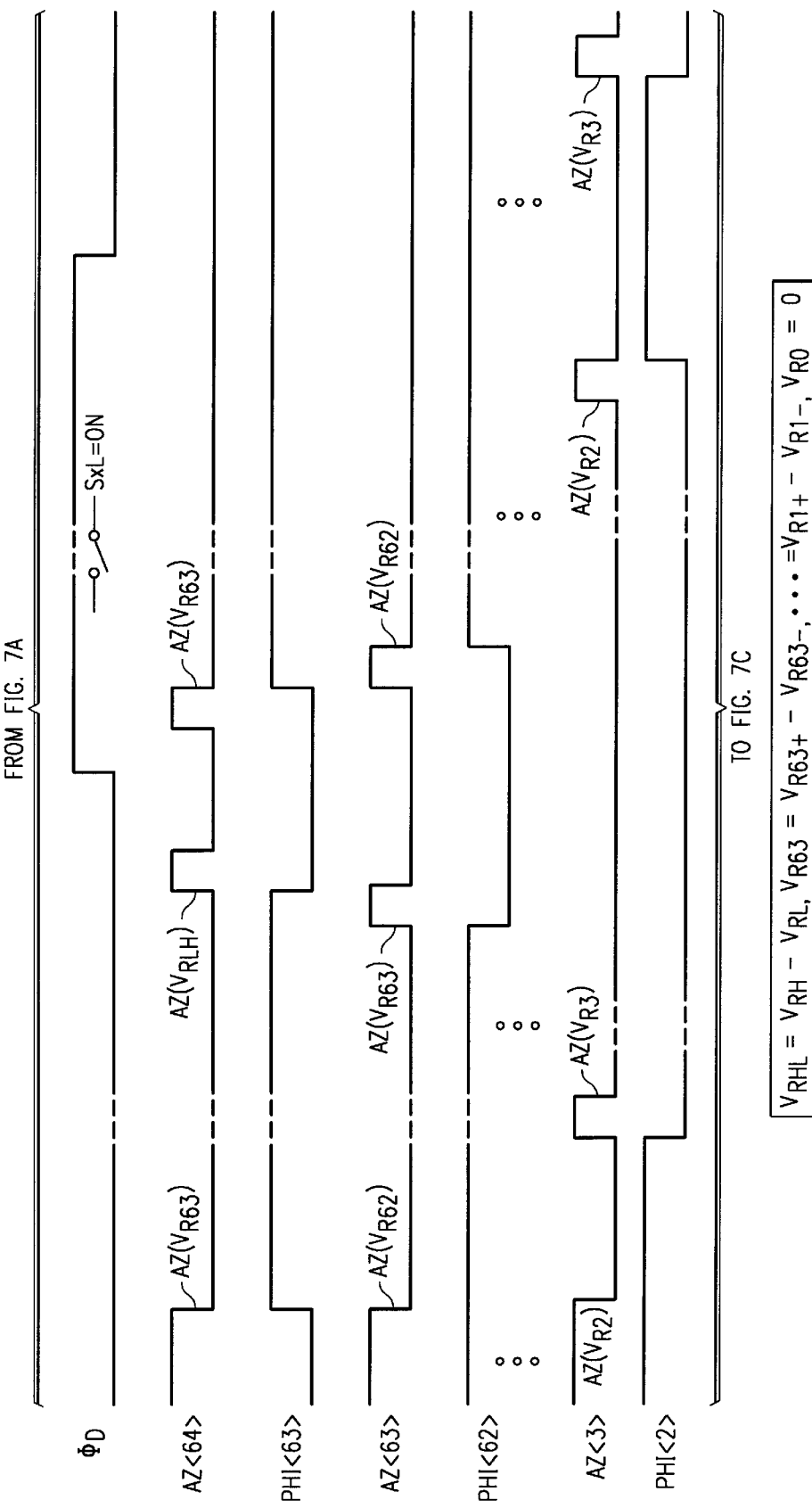
Figure 7C:
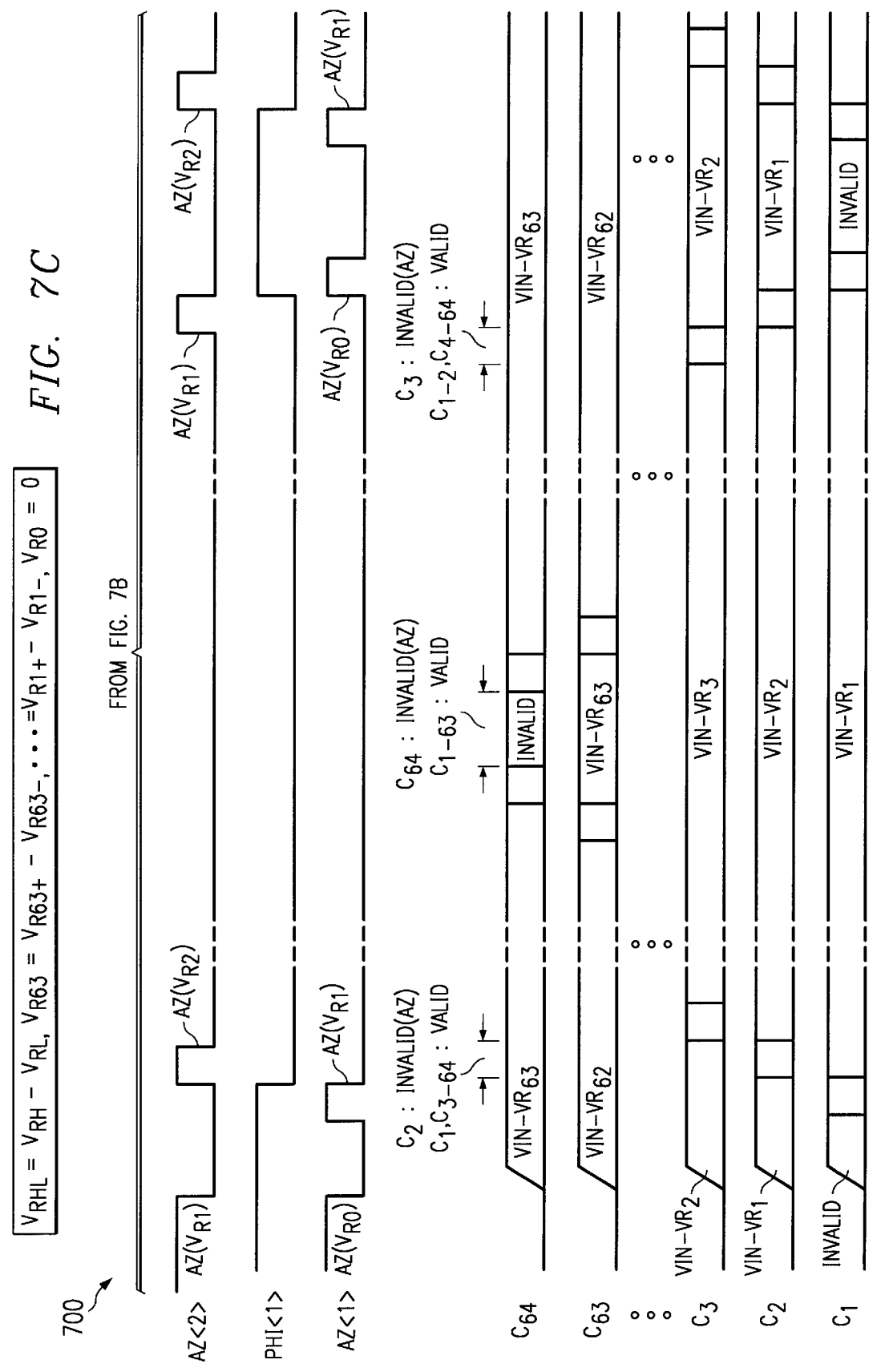

FIG. 7 is a waveform timing diagram 700 illustrating timing relationships for various signals associated with the background offset cancellation architecture 600 using IAZ shown in FIG. 1. Initially, when the reset signal RES is high, the reference tap values at $n_{64+}$, $n_{63+}$, . . . , $n_{1+}$ are $V_{R63+}$, $V_{R62+}$, $V_{cm}$, and at $n_{64-}$, $n_{63-}$, . . . , $n_{1-}$ are $V_{R63-}$, $V_{R62-}$, . . . , $V_{cm}$ respectively, as stated herein before. During time $t_0$, all the comparators ($C_1$–$C_{64}$) 104 are auto-zeroed with reference voltages $V_{R0}$–$V_{R63}$ respectively, before the conversion starts. During time $t_1$, $\phi_{reset}$ and $\phi_{ru}$ are high and the reference tap values at $n_{64+}$, $n_{63+}$, . . . , $n_{1+}$ are $V_{RH}$, $V_{R63+}$, . . . , $V_{R1+}$ and at $n_{64-}$, $n_{63-}$, . . . , $n_{1-}$ are $V_{RL}$, $V_{R63-}$, . . . , $V_{R1-}$ respectively. The offset cancellation of the opamps (514, 534) is also carried out during $t_1$. During $t_2$, $\phi_U$ goes high and the reference tap values settle at their correct values after the offset has been cancelled. Further, during $t_1$ and $t_2$, all comparators 104 are set to the comparison state and the conversion is achieved by comparators $C_2$–$C_{64}$. During the next period $t_3$, comparator $C_1$, that was auto-zeroed with $V_{R0}$ during $t_0$ is now auto-zeroed with $V_{R1}$ while the conversion is achieved by $C_2$–$C_{64}$. During the next period $t_4$, comparator $C_2$ that was previously auto-zeroed with $V_{R1}$ during $t_0$ is now auto-zeroed with $V_{R2}$ and the conversion is achieved by $C_1$, and $C_3$–$C_{64}$. A sixty-four to sixty-three multiplexer 106 after the comparators 104 selects the valid comparator 104 outputs to a bubble correction circuit 108 and a thermometer code encoder 110 as shown in FIG. 1. After $C_{64}$ is auto-zeroed with $V_{RHL}$ during $t_{66}$, $\phi_U$ goes low and $\phi_{reset}$ and $\phi_{rd}$ go high by the end of $t_{67}$. During $t_{68}$, again, the opamp offset cancellation is carried out and the reference tap values at $n_{64+}$, $n_{63+}$, . . . , $n_{1+}$ are $V_{R63+}$, $V_{R62+}$, . . . , $V_{cm}$, and at $n_{64-}$, $n_{63-}$, . . . , $n_{1-}$ are $V_{R63-}$, $V_{R62-}$, . . . , $V_{cm}$ respectively. Also, during $t_{68}$–$t_{69}$, the switches (S1H–S64H) 112 turn off and switches (S1L–S64L) 114 turn on and the reference taps settle to their correct values after the opamp offset has been cancelled. During $t_{69}$, $\phi_D$ goes high and $C_{64}$ is again auto-zeroed with $V_{R63}$ during $t_{70}$. Then $C_{63}$ is auto-zeroed with $V_{R62}$ during $t_{71}$ and the sequence continues on until $C_1$ is auto-zeroed with $V_{R0}$ during $t_{133}$. The switches (S1L–S64L) 114 turn off at the end of $t_{134}$ and switches (S1H–S64H) 112 turn on during $t_{135}$ when $\phi_{reset}$ and $\phi_{ru}$ again go high and the opamp offset cancellation is being carried out. Finally, during $t_{137}$, $C_1$ is auto-zeroed with $V_{R1}$ and the sequence continues.

In summary explanation, a differential comparator auto-zeroing scheme suitable for use with a high-speed flash ADC, reduces the auto-zeroing rate without requiring an extra auto-zeroing period for the whole ADC, and further provides a high-speed comparator that compares several times with only one auto-zeroing. The scheme performs offset cancellation in the background by using one extra comparator slice and by making the auto-zeroing period independent of the operating clock period to extend the available conversion time. The scheme employs a unique circuit architecture that eliminates a large number of switches (transistors) such that the clock driver for the switches can be made very small, resulting in substantially reduced power consumption and improved settling characteristics of the reference resistor ladder during auto-zeroing. The scheme described herein also corrects the finite gain error in the overall ADC transfer characteristic due to the offset of the operational amplifiers used in switching the reference taps.

In view of the above, it can be seen the present invention presents a significant advancement in the art of background offset cancellation circuit technology associated with flash ADCs. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular transistor types, the present inventive structures and characteristics are not necessarily limited to particular transistor types or sets of characteristics as used herein. It shall be understood the embodiments described herein above can easily be implemented using many diverse transistor types so long as the combinations achieve a background offset cancellation technique for flash ADCs according to the inventive principles set forth herein above.

What is claimed is:

1. A background offset cancellation circuit comprising:
    a first resistor ladder having a plurality of reference taps, the first resistor ladder connected at its first end to a first reference current source and further connected at its opposite end to a first switching circuit; and
    a second resistor ladder having a plurality of reference taps, the second resistor ladder connected at its first end to a second reference current source and further connected at its opposite end to a second switching circuit;
    wherein the first switching circuit is operational in response to a clock driver signal to change signal values at each first resistor ladder reference tap, and wherein the second switching circuit is operational in response to the clock driver signal to change signal values at each second resistor ladder reference tap.

2. The background offset cancellation circuit according to claim 1 wherein the first switching circuit comprises:
- a first switching transistor having a control terminal driven by a first operational amplifier, and further having a current input terminal and a current output terminal;
- a feedback resistor connecting the current input terminal to the opposite end of the first resistor ladder;
- a first complementary switch connecting a positive input of the first operational amplifier to the current input terminal; and
- a second complementary switch connecting the positive input of the first operational amplifier to the opposite end of the first resistor ladder,
- wherein the first and second complementary switches operate in complement with one another and in response to the clock drive signal, and further wherein the first resistor ladder reference tap signal values move up and down in response to operation of the first and second complementary switches.

3. The background offset cancellation circuit according to claim 2 wherein the second switching circuit comprises:
- a second switching transistor having a control terminal driven by a second operational amplifier, and further having a current input terminal and a current output terminal;
- a feedback resistor connecting the second switching transistor current output terminal to the opposite end of the second resistor ladder;
- a third complementary switch connecting a negative input of the second operational amplifier to the second switching transistor current output terminal; and
- a fourth complementary switch connecting the negative input of the second operational amplifier to the opposite end of the second resistor ladder,
- wherein the third and fourth complementary switches operate in complement with one another in response to the clock drive signal, and further wherein the second resistor ladder reference tap signal values move up and down in response to operation of the third and fourth complementary switches.

4. The background offset cancellation circuit according to claim 1 wherein the first and second resistor ladders each comprise the same number of reference taps.

5. The background offset cancellation circuit according to claim 4 wherein the first and second resistor ladders comprise solely of resistors having a single common value.

6. The background offset cancellation circuit according to claim 5 wherein each switching circuit feedback resistor has a value equal to the single common value.

7. The background offset cancellation circuit according to claim 6 wherein the first reference current source is further connected to a supply voltage.

8. The background offset cancellation circuit according to claim 7 wherein the second reference current source is further connected to a circuit ground.

9. The background offset cancellation circuit according to claim 1 further comprising a plurality of differential comparators, wherein each differential comparator is operational to receive a respective first resistor ladder reference tap signal during a first time period and a corresponding second resistor ladder reference tap signal during the first time period, and a respective first resistor ladder reference tap signal moved by ½ LSB during a second time period and a corresponding second resistor ladder reference tap signal moved by ½ LSB during the second time period, wherein the first and second time periods are determined by the clock driver signal.

10. A background offset cancellation circuit comprising:
- a first resistor ladder connected at one end to a first reference current source and having a plurality of reference taps;
- a second resistor ladder connected at one end to a second reference current source and having a plurality of reference taps;
- a circuit for changing signal values at each first resistor ladder reference tap; and
- a circuit for changing signal values at each second resistor ladder reference tap.

11. The background offset cancellation circuit according to claim 10 wherein the circuit for changing signal values at each first resistor ladder reference tap comprises a first switching circuit connected between an opposite end of the first resistor ladder and a circuit ground.

12. The background offset cancellation circuit according to claim 11 wherein the circuit for changing signal values at each second resistor ladder reference tap comprises a second switching circuit connected between an opposite end of the second resistor ladder and a voltage supply.

13. A method of canceling offset and 1/f noise in background in a flash ADC, comprising the steps of:
- providing a flash ADC having a plurality of differential comparators and a matched pair of resistor ladders, each resistor ladder connected to a signal level shifting circuit, each resistor ladder having a plurality of reference taps such that each reference tap on one resistor ladder corresponds to a reference tap on the other resistor ladder to create a plurality of pairs of corresponding reference taps;
- passing a reference current through each resistor ladder such that a reference tap signal is generated at each reference tap to provide a plurality of pairs of corresponding reference tap signals and such that each pair of corresponding reference tap signals can provide a differential reference tap value, wherein each reference tap signal is associated with a reference tap value; and
- shifting each reference tap value up and down a predetermined amount in response to a clock driver signal.

14. The method according to claim 13 further comprising the step of connecting each pair of corresponding reference tap signals to a respective differential comparator such that each differential comparator can be auto-zeroed in response to reference tap signals having values that move up and down by a predetermined amount in response to the clock driver signal to perform auto-zeroing.

* * * * *